US007873424B1

(12) United States Patent
Goeppner et al.

(10) Patent No.: US 7,873,424 B1
(45) Date of Patent: Jan. 18, 2011

(54) SYSTEM AND METHOD FOR OPTIMIZING DIGITAL AUDIO PLAYBACK

(75) Inventors: Andrew T. Goeppner, Plain City, OH (US); Aaron Ambrose, Dublin, OH (US); John Vilkinofsky, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 1315 days.

(21) Appl. No.: 11/279,726

(22) Filed: Apr. 13, 2006

(51) Int. Cl.
*G06F 17/00* (2006.01)
*H04R 5/00* (2006.01)
*H03G 3/00* (2006.01)
*H04B 1/00* (2006.01)

(52) U.S. Cl. .............................. 700/94; 381/18; 381/61; 381/86

(58) Field of Classification Search .................. 700/94; 381/17–23, 310, 86, 61
See application file for complete search history.

(56) References Cited

U.S. PATENT DOCUMENTS 5,420,931 A * 5/1995 Donner ........................ 381/86
6,665,409 B1 12/2003 Rao
8,678,653 1/2004 Tsushima et al.
6,839,676 B2 1/2005 Saito
7,085,710 B1 * 8/2006 Beckert et al. .............. 704/201
7,424,333 B2 * 9/2008 Williams et al. .............. 700/94
2003/0023429 A1 1/2003 Claesson et al.
2004/0001403 A1 * 1/2004 Endo ....................... 369/47.24
2004/0039464 A1 2/2004 Virolaninen et al.
2004/0044527 A1 3/2004 Thumpudi et al.
2004/0184573 A1 9/2004 Anderson et al.
2004/0249489 A1 12/2004 Dick
2005/0015259 A1 1/2005 Thumpudi et al.
2007/0055510 A1 * 3/2007 Hilpert et al. ............... 704/230

OTHER PUBLICATIONS

Cross, Jason, "Audio Codec Quality Shootout", Apr. 2, 2004, extremetech.com, http://www.extremetech.com/print_article2/0,1217,a%253D123493,00.asp.*
EBU-UER, "EBU subjective listening tests on low bitrate audio codecs", Jun. 2003, EBU-UER, http://tech.ebu.ch/docs/tech/tech3296.pdf.*

* cited by examiner

*Primary Examiner*—Vivian Chin
*Assistant Examiner*—Daniel R Sellers
(74) *Attorney, Agent, or Firm*—Plumsea Law Group, LLC; Mark E. Duell

(57) ABSTRACT

A system and method for optimizing digital audio playback is disclosed. The system and method can prevent playback of a digital audio file in an enhanced mode if the digital audio file does not meet a predetermined criterion, such as a particular bit rate. One example of an enhanced mode is a simulated multi-channel surround sound mode.

24 Claims, 5 Drawing Sheets

SYSTEM AND METHOD FOR OPTIMIZING DIGITAL AUDIO PLAYBACK

BACKGROUND OF THE INVENTION

1. Field of the Invention

The present invention relates generally to audio systems, and in particular to audio systems for motor vehicles.

2. Description of Related Art

A great number and variety of audio systems for sound and musical playback are available. A basic audio system may be as simple as an AM/FM radio and a loudspeaker. More sophisticated systems often include the ability to play many different types of media, including cassette tapes, compact disks (CDs), and, in some cases, digital versatile disks (DVDs).

Some audio systems include sound enhancement features. While many basic audio systems are capable of two-channel (stereo) playback, other more sophisticated audio systems are capable of reproducing more channels of sound (multi-channel sound). If an audio source does not provide enough data or channels for more than two channels of sound, some audio systems may use algorithms to simulate additional channels of sound to create, for example, a simulated 5.1 channel surround sound playback from a two-channel audio source. Examples of these sound enhancement algorithms include Dolby Pro-Logic II™, DTS Circle Surround™, and Bose Centerpoint™.

A CD stores two channels of audio at known bit rate which is an industry standard, 44.1 kHz. Since the CD is currently the overwhelming preference in media formats used today, it can be assumed that all enhanced playback algorithms use this as a reference to tune their performance. Because audio information stored on a CD using a traditional CD audio format is generally of relatively high quality, the audio played from a CD will sound good when an enhanced playback algorithm, such as a simulated surround sound playback algorithm, is used.

More recently, however, different formats and media are used to store digital audio information. Some audio systems allow hard disk drives with stored digital audio to be directly connected to the system. Other audio systems are capable of reading an optical disk, such as a CD-ROM or DVD with digital audio information stored in a digital audio file format. In some cases, a file format different than the one used for a traditional CD is used.

When audio is stored digitally in a format other than the traditional CD audio format, digital audio information can be stored in many different storage formats and quality levels. Moreover, the quality of the recording may be deliberately reduced in order to store more audio in the same amount of space. This process of reducing the size of a digital audio file is referred to as compression.

Compression algorithms are optimized by eliminating information in the audio signal that is not readily perceived by human hearing, thus giving the best sound quality while reducing the file size. It is known that there is a trade off between audio performance and file size. Since these enhancement algorithms also use the same information in the audio stream to simulate surround sound, the higher the compression, the less effective the simulation. Because of this, some compressed digital audio files may not sound good when played back using an enhanced mode. Even if a digital audio file sounds good in a non-enhanced playback mode (e.g., two-channel stereo), the sound quality may deteriorate if a simulated surround sound or other enhanced playback algorithm is used.

Motor vehicles typically include at least a basic audio system, although more sophisticated audio systems with enhanced playback algorithms are also available. As audio systems need to process and playback various different types of digital audio files, and as hard disk drives and hard disk drive docking devices become more common in motor vehicle audio systems, audio systems need to be increasingly versatile. These systems must be able to receive, process and properly playback a variety of different types of digital audio files. Current audio systems lack these, as well as other abilities.

SUMMARY OF THE INVENTION

A system and method for optimizing playback of digital audio information is disclosed. The invention can be used in connection with a motor vehicle. The term "motor vehicle" as used throughout the specification and claims refers to any moving vehicle that is capable of carrying one or more human occupants and is powered by any form of energy. The term motor vehicle includes, but is not limited to cars, trucks, vans, minivans, SUV's, motorcycles, scooters, boats, personal watercraft, and aircraft.

In one aspect, the invention provides a motor vehicle. The motor vehicle comprises an audio system capable of playing digital audio in an enhanced mode and a non-enhanced mode. The audio system prevents the digital audio from being played in the enhanced mode if a bit rate associated with the digital audio is less than a predetermined criterion.

In another aspect, the non-enhanced mode comprises a two-channel mode and the enhanced mode comprises a simulated multi-channel mode.

In another aspect, the enhanced playback mode comprises a simulated surround sound playback mode.

In another aspect, the predetermined criterion is predetermined based on one or more characteristics of the digital audio.

In another aspect, the predetermined criterion is a predetermined bit rate.

In another aspect, the predetermined criterion is a predetermined bit rate, the predetermined bit rate may be determined based on a file type of the digital audio.

In another aspect, if the audio system prevents the digital audio from being played in the enhanced mode, the audio system allows the digital audio to be played in the non-enhanced mode.

In another aspect, the audio system further comprises one or more peripherals selected from the group consisting of a hard disk drive and a hard disk drive docking device.

In another aspect, the invention provides an audio system. The audio system comprises a digital audio source and a central unit associated with the digital audio source. The central unit prevents play of digital audio from the digital audio source in an enhanced mode if a bit rate associated with the digital audio is less than a predetermined bit rate.

In another aspect, the digital audio source is a hard disk drive.

In another aspect, the enhanced mode is a simulated multi-channel mode.

In another aspect, the central unit causes the digital audio to be played in a non-enhanced mode if the bit rate associated with the digital audio is less than the predetermined bit rate.

In another aspect, the predetermined bit rate is predetermined based on one or more characteristics of the digital audio.

In another aspect, the digital audio source is selected from the group consisting of a CD player and a DVD player.

In another aspect, the invention provides a method for optimizing digital audio playback. The method comprises the steps of determining a bit rate associated with a digital audio file, comparing the bit rate with at least one predetermined criterion, and preventing playback in an enhanced mode of the bit rate does not meet the predetermined criterion.

In another aspect, the predetermined criterion is a predetermined bit rate.

In another aspect the step of preventing playback in the enhanced mode if the bit rate does not meet the predetermined criterion comprises preventing playback in the enhanced mode if the bit rate is lower than the predetermined bit rate.

In another aspect the method further comprises notifying a user that the digital audio file does not meet the predetermined criterion.

In another aspect the enhanced mode comprises a playback mode that simulates more than two channels of audio.

In another aspect, the invention provides machine-readable instructions interoperable with a machine to perform the method described above.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

Figure 1:
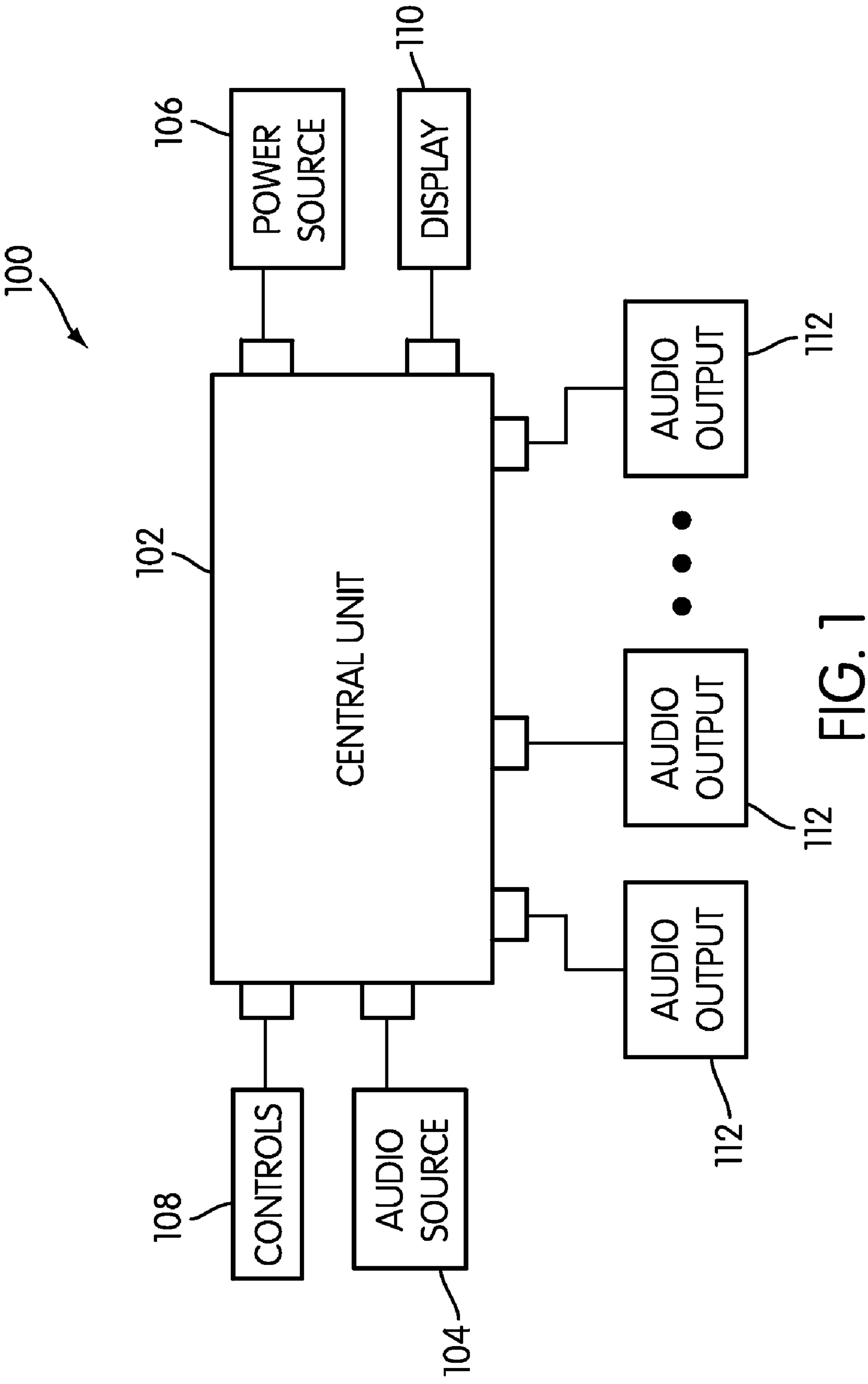
FIG. 1 is a schematic diagram of an audio system according to a preferred embodiment.

FIG. 1 is a schematic view of an audio system, generally indicated at 100, according to a preferred embodiment of the invention. In some embodiments, audio system 100 comprises, among other components, a central unit 102. In some embodiments, central unit 102 is capable of receiving information, processing that information, and providing an audio output. In general, central unit 102 helps to manage and control the audio playback functions of audio system 100, and may include any components or features that are necessary for that function.

Examples of such components or features include digital signal processors (DSPs), input/output handling circuits, digital-to-analog (D/A) and analog-to-digital (A/D) converters, and other related components. Central unit 102 may be implemented as a single integrated circuit, as a group of interoperating circuits or modules, or in any other way known in the art.

In the embodiment shown in FIG. 1, various items are associated with central unit 102. As shown in FIG. 1, audio source 104, power source 106, controls 108, display 110, and a plurality of audio outputs 112, which would typically be in communication with a corresponding number of speakers (not shown in FIG. 1), are all preferably associated with central unit 102. Preferably, power source 106 provides power to central unit 102 and the various other items are in communication with central unit 102 using some form of communication. For example, the various items can communicate with one another using wire line or wireless communications protocols. The various items can also communicate with one another using a network, either wire line based network or a wireless network. In some embodiments, one or more of the various items are integrally formed with central unit 102.

Although only one audio source 104 is shown in FIG. 1, any number and variety of audio sources 104 may be connected to central unit 102, including cassette decks, CD players, hard disk drives, and satellite radio receivers and devices, such as docking devices, intended to provide access to other, peripheral audio sources. These and other audio sources are disclosed below in connection with FIG. 5. For simplicity, the description focuses for now on an exemplary embodiment shown in FIG. 1, where audio source 104 is a hard disk drive that includes digital audio information.

The term "digital audio" refers to audio that is stored as a digital representation of an audio waveform, as opposed to a continuous, analog audio waveform, for example, as would be stored on a cassette tape. The digital audio may be music, spoken word programming, or any other form of sound stored digitally. Typically, digital audio information ultimately includes a binary sequence.

Of the other components connected to central unit 102, controls 108 allow the user to direct central unit 102 to playback selected pieces of digital audio, and may also allow control over common playback parameters, such as bass, treble, fade, and balance (left to right). Display 110, which in some embodiments can include a color or monochrome LCD, provides user feedback. The connections between central unit 102 and the other components illustrated in FIG. 1 may use any communication scheme, including analog communication, optical communication, and digital communications. Audio outputs 112 may also use any of these communication schemes to output sound information to speakers or other peripherals.

Each of audio outputs 112 to which the central unit 102 is connected may have different characteristics, and any number of audio outputs 112 may be connected to central unit 102. In one example, speakers of different characteristics may be connected to the various audio outputs 112, including tweeters, midrange speakers, and subwoofers, to name a few. Central unit 102 may be programmed to output signals differently to each of audio outputs 112 to take advantage of the different characteristics of the speakers or other peripherals that are connected to the audio outputs.

Central unit 102 preferably has at least one pre-set playback mode, including enhanced and non-enhanced playback modes. In some embodiments, central unit 102 includes a variety of pre-set playback modes. Non-enhanced playback modes, for example, may include single channel (monaural) and two-channel (stereo) playback modes. Some enhanced playback modes may include playback modes that use more than two channels along with playback modes that use algorithms to simulate the presence of more than two channels where only two channels are available. Examples of these algorithms include Dolby Pro-Logic II™, DTS Circle Surround™, and Bose Centerpoint™. As used throughout this specification, the term "channel" refers to a distinct band or portion of an audio signal or distinct parcel of audio information. For example, conventional stereo playback uses two channels, conventionally referred to as left and right, which are intended to be reproduced by left and right speakers, respectively.

The quality of a digital audio representation can vary. More specifically, the quality of digital audio depends on several factors, including how frequently the original audio waveform was sampled (the term "sample rate" or "bit rate" is sometimes used express the frequency of the sample) during the initial conversion from analog to digital and whether and how the digital audio information was compressed to save space on the recording medium. Generally, higher sample rates result in more accurate and higher quality digital audio files. Compression usually results in the loss of some audio information, and different types of compression techniques have different levels of associated loss. Generally, the less information lost during the compression process, the higher the quality of the resulting digital audio file. In general, the more information the digital audio file contains, the more accurate and better the sound quality.

There are a number of sound quality indicators that can be used to gauge the quality of any particular digital audio file. Among these sound quality indicators are the bit rate, the file type, and the compression type of the digital audio. Of these indicators, the bit rate can be used determine the general quality or integrity of a digital audio file. Bit rate can be related to how many bits of data per unit of time are being used to describe the audio signal. One common unit for expressing bit rate is kilobits (kb) per second (kb/s). Digital audio may be recorded with a fixed bit rate, such that all parts of the audio have the same level of quality, or with a variable bit rate (VBR), where different portions of audio are recorded or encoded with different bit rates. VBR is often used to reduce the size of a digital audio file by assigning high bit rates to complex portions of the digital audio and relatively lower bit rates to non-complex portions of the digital audio, for example, silent pauses.

In addition to CD audio, digital audio may be recorded in a number of different formats. Each format has specific characteristics, advantages, and disadvantages. Some of the common formats for digital audio include MP3, AAC, WAV, and AIFF. These formats can be used to store digital audio information on hard disk drives. However, the preferred and other embodiments of the invention will function with any digital audio file format having a fixed or variable bit rate. As long as the quality of the digital file can be ascertained or determined in some way, principles and teachings of the present invention can to apply to any digital audio format.

As described above, some embodiments of central unit 102 preferably include both enhanced and non-enhanced playback modes. Using controls 108, the user may instruct central unit 102 to play digital audio in a particular enhanced playback mode, for example, in simulated 5.1 surround sound. Alternatively, central unit 102 may be preset to play all digital audio in a particular enhanced playback mode. However, it has been discovered that digital audio with lower bit rates may not be suitable for one or more enhanced playback modes. In some cases, digital audio with a low bit rate sounds better when played back without enhancement than it does when played back using an enhanced mode.

Figure 2:
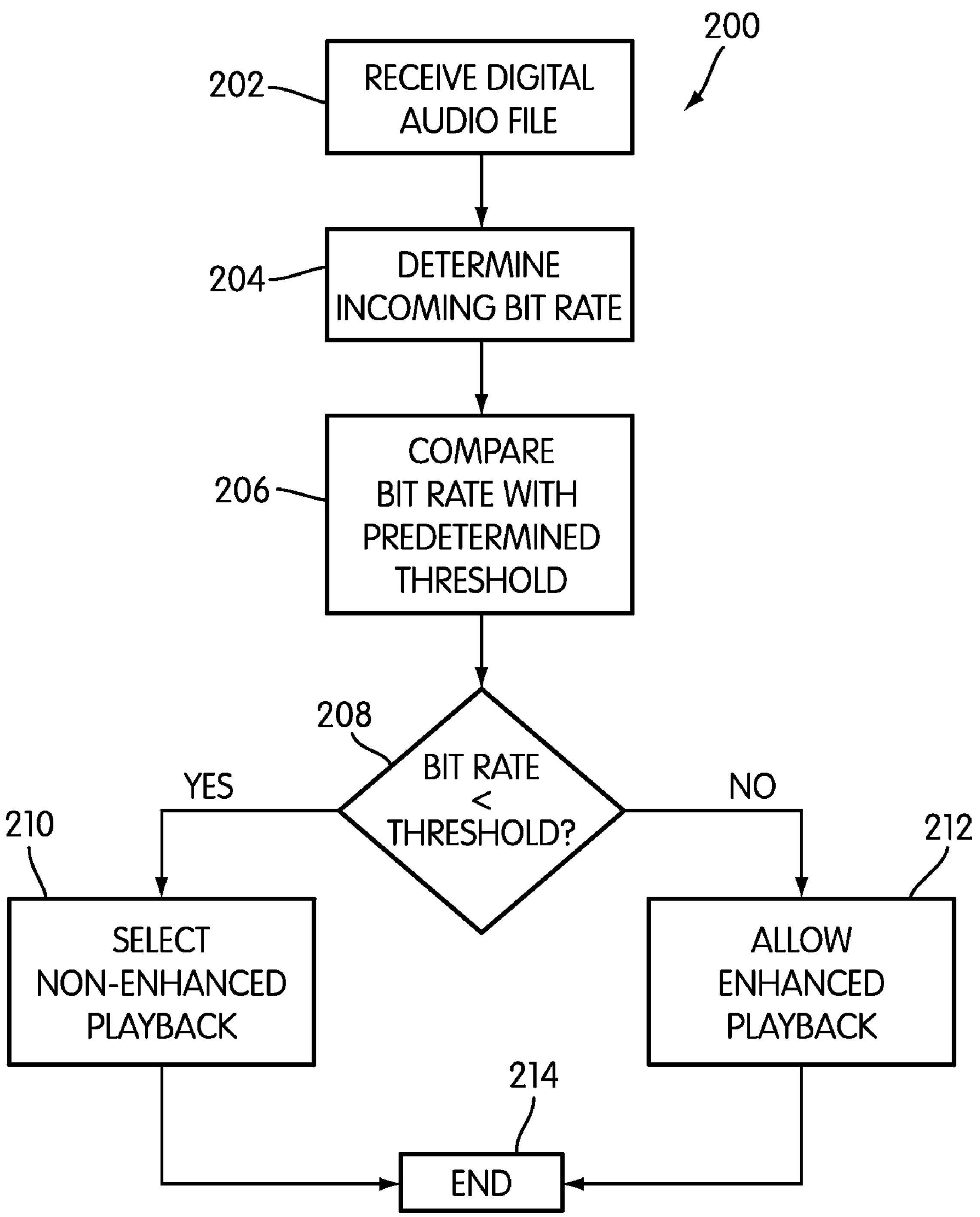
FIG. 2 is a flow diagram of a method for optimizing digital audio playback in accordance with the preferred embodiment.

Therefore, embodiments of central unit 102 implement a method for optimizing digital audio playback by enabling or disabling certain playback modes based on the bit rate of the digital audio. FIG. 2 is a preferred embodiment of a flow diagram of a method, generally indicated at 200. Method 200 begins at 202 when a user selects a particular digital audio file for playback.

After a particular digital audio file has been selected, the method moves to step 204, where the bit rate of the selected digital audio is determined. The bit rate can be determined in any number of ways. In some cases, the bit rate is determined by reading information related to the digital audio file. In some cases, the file header information (or frame header information, if the file is divided into frames) is read. In some cases, the bit rate is determined by reading an identity tag associated with the digital audio file. In some cases, the identity tag is an ID3 tag associated with an MP3 file. The bit rate can also be determined by reading information associated with a file allocation table (FAT). Some embodiments use FAT information to determine the file's size on disk and make appropriate calculations to determine the bit rate. The bit rate can also be dynamically calculated by sensing or monitoring the incoming digital bit stream.

Once the bit rate of the incoming digital audio has been determined, method 200 moves on to step 206, where the determined bit rate is compared with a predetermined threshold. The particular predetermined threshold that is used in step 206 may vary and may be selected to fit the performance characteristics of audio system 100 and/or ambient acoustic conditions of the particular listening space. For example, if audio system 100 is used in a motor vehicle, the selection of the predetermined threshold can be influenced by the interior acoustics of the motor vehicle.

Other factors that can be considered in establishing the threshold include the particular enhanced playback mode that has been requested, the characteristics of the digital audio, and a subjective assessment of sound quality. Multiple predetermined thresholds may be programmed into central unit 102. In some cases, a different threshold is selected for each type of digital audio compression technique. For example, a first threshold might be established for MP3 files, a second for ACC files, a third for WAV, and so on. Different thresholds can be established for different types of enhanced playback modes. For example, a threshold can be established for Dolby Pro-Logic II, another for DTS Circle Surround, and so on. In some embodiments, thresholds are established based on both the digital compression technique and the enhanced playback mode. Thus, if an embodiment includes thresholds for four different types of compression techniques and three different enhancement modes, a total of 12 unique thresholds would be established. Some specific examples of predetermined thresholds are given below.

Method 200 continues with step 208. At step 208, the determined bit rate is compared to the applicable predetermined threshold. If the determined bit rate is less than the predetermined threshold, method 200 passes to 210, in which central unit 102 selects a non-enhanced playback mode. By doing so, central unit 102 prevents the digital audio file from being played in the enhanced mode. As noted above, this can improve the sound quality of a low bit rate digital audio file. In some embodiments, step 210 includes a step of re-selecting the enhanced playback mode after playback of the digital audio file has finished.

After step 210, method 200 moves to step 214, where method 200 ends. In some embodiments, where a play list or some other sequential system of playing digital audio files exists, method 200 returns to step 202 when the next digital audio file is received.

Returning to step 208, if the determined bit rate is greater than or equal to the threshold, method 200 passes to 212, in which central unit 102 allows the playback using the selected enhanced playback mode. After step 212, method 200 moves to step 214, where method 200 ends. In some embodiments, where a play list or some other sequential system of playing digital audio files exists, method 200 returns to step 202 when the next digital audio file is received.

Figure 3:
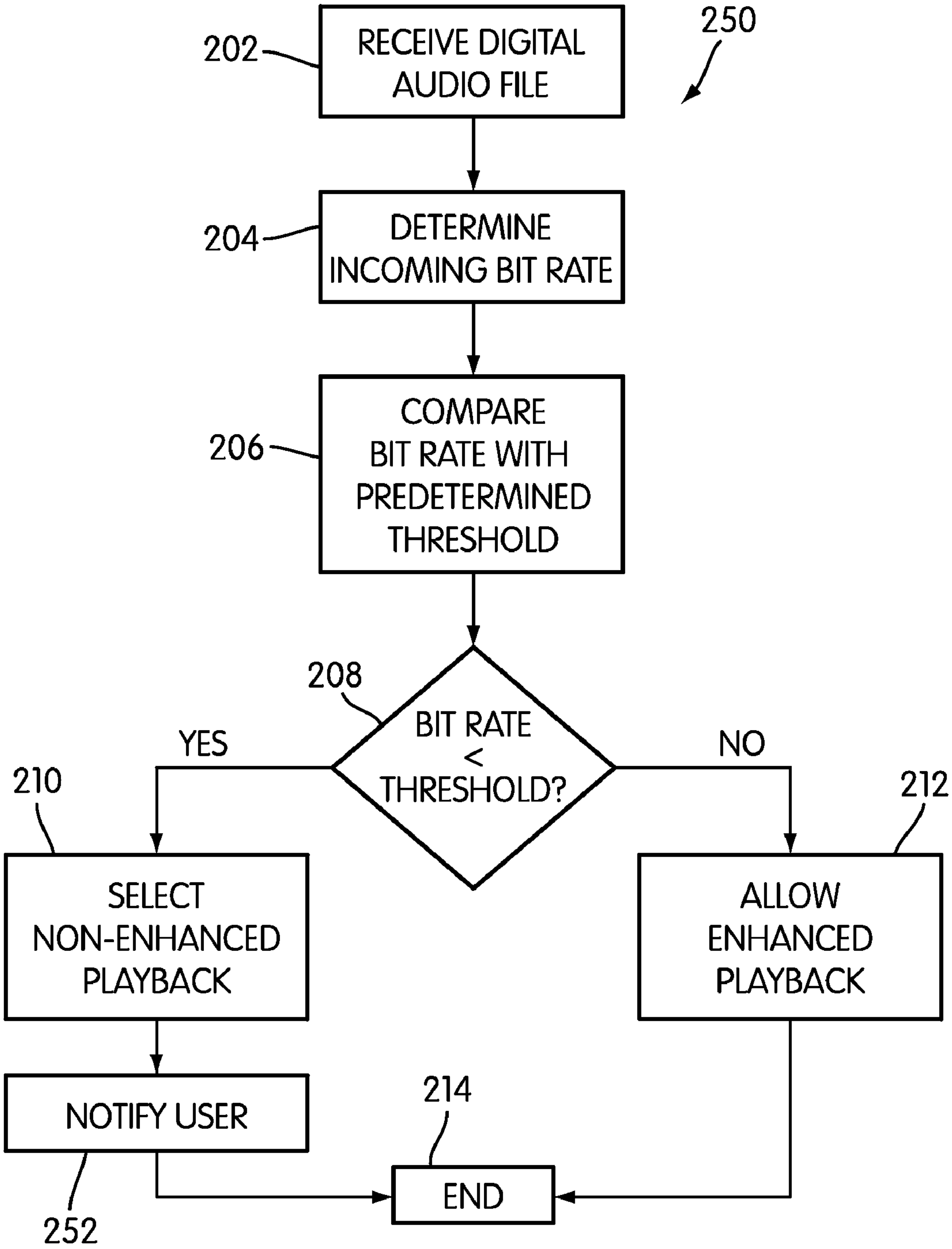
FIG. 3 is a flow diagram of a method for optimizing digital audio playback in accordance with an alternate embodiment.

FIG. 3 is a flow diagram illustrating a method 250 that is similar to method 200 of FIG. 2, but with some additional steps. Since methods 200 and 250 include some similar steps, the description of those similar steps applies for method 250. The difference between method 200 and method 250 is that in method 250, after central unit 102 determines in 208 that the determined bit rate is less than the threshold and selects non-enhanced playback in 210, method 250 moves to step 252 where the user is notified. In some embodiments, a visual notice is provided, for example, using display 110, that the selected enhanced playback mode is unavailable for that particular digital audio file. In other embodiments, an audible notice is provided to the user.

As an example of the kinds of thresholds that might be used in methods 200 and 250, and in other methods according to embodiments of the invention, consider a situation where a particular enhanced playback mode is capable of rendering two channel audio is simulated 5.1 surround sound. In this example, the enhanced mode algorithm requires a minimum bit rate of 128 kb/s from a two-channel digital audio file encoded in MP3 format in order to provide good sound quality when using the enhanced playback mode. The predetermined threshold for this fixed bit rate digital audio for that enhanced playback mode would then be set to 128 kb/s. However, the predetermined threshold could be less for a variable bit rate audio file, for example, 100 kb/s average bit rate, because some variable bit rate digital audio files may not require as high of an average bit rate to produce sound comparable to that of fixed bit rate digital audio with higher bit rates. The particular thresholds used may vary, and may be determined based on the various factors discussed above.

Methods 200 and 250, and other methods according to other embodiments of the invention may be encoded in any machine-readable language compatible with central unit 102 to implement the illustrated tasks. The particular language used may be a high level language (e.g., C, C++, Java, J++, Visual Basic, etc.) or it may be a low-level language (e.g., assembly code), depending on the capabilities of central unit 102. More generally, methods according to embodiments of the invention may be encoded in any machine-readable form, to be stored on any machine-readable medium, so as to interoperate with a machine, such as central unit 102, to perform any of the methods.

Figure 4:
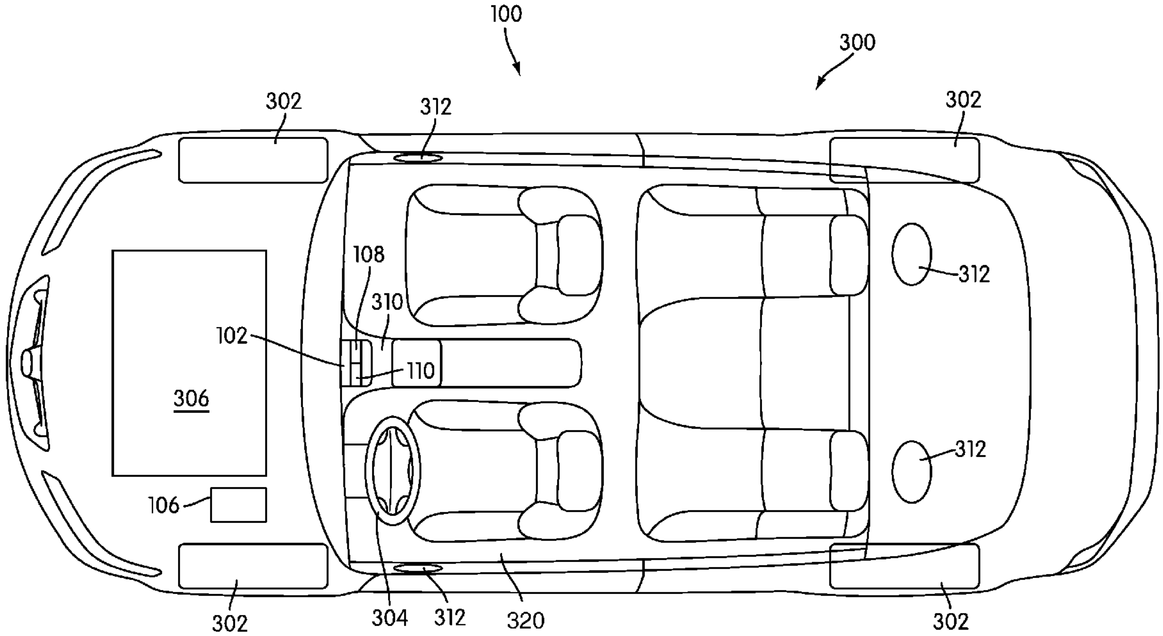
FIG. 4 is a schematic top plan view of a motor vehicle according to another preferred embodiment.

In some embodiments, audio system 100 is associated with a motor vehicle. FIG. 4 is a schematic top view of a preferred embodiment of a motor vehicle, generally indicated as 300, that includes audio system 100 according to another preferred embodiment of the invention. As installed in motor vehicle 300, audio system 100 is preferably capable of preventing playback of a digital audio file in an enhanced playback mode if the digital audio file does not meet a predetermined criterion and, in particular, is capable of executing methods 200 and 250 and the other functions described above. Preferably, audio system 100 functions in motor vehicle 300 in the manner described above.

Motor vehicle 300 has at least one wheel, a steering system, an engine, and a passenger compartment that is capable of supporting at least one human occupant. In the embodiment shown in FIG. 4, motor vehicle 300 includes four wheels 302, a steering system that includes steering wheel 304 and other associated structures (not shown in FIG. 1), and an engine 306. Motor vehicle 300 also includes a passenger compartment 320, which can accommodate a driver and a number of passengers. In some embodiments, for example, where the motor vehicle is a motorcycle, passenger compartment 320 is external, and the occupants ride on top of the motor vehicle.

Central unit 102 of audio system 100 is installed in a central console 310, and controls 108 and display 110 are accessible to the driver and front-seat passenger. Audio system 100 can include any number of loudspeakers. In the embodiment shown in FIG. 4, four speakers 312 are arrayed around the interior of motor vehicle 300, two in the front and two in the rear, each speaker connected to an audio output 112 (see FIG. 1) of audio system 100.

As those of skill in the art will realize, only certain components of motor vehicle 300 are included, for ease of description. In addition to those systems and methods described here, motor vehicle 300 may include any other system and/or component.

Engine 306 can be any device that provides or converts energy. In some embodiments, engine 306 may be a gasoline engine, a diesel engine, a hybrid gasoline/battery engine, or any other type of engine suitable for a motor vehicle. Preferably, engine 306 includes provisions that can provide power to audio system 100. In some cases, these provisions can include a battery or an alternator. Either of these items or some other device can act as power source 106 for audio system 100.

The placement of controls 108 and other features of audio system 100 may vary widely from embodiment to embodiment. For example, in other embodiments, some of the audio system controls may be on steering wheel 304, and secondary controls may be provided in the rear of the cabin for the use of rear-seat passengers. As another example, in some embodiments, storage media interfaces (such as CD players, cassette players, and hard disk drives) may be provided proximate to controls inside the motor vehicle. In other embodiments, storage media interfaces may be located in other parts of the motor vehicle, for example, a CD-changer or hard disk drive mounted in the trunk or other cargo space of the motor vehicle.

Figure 5:
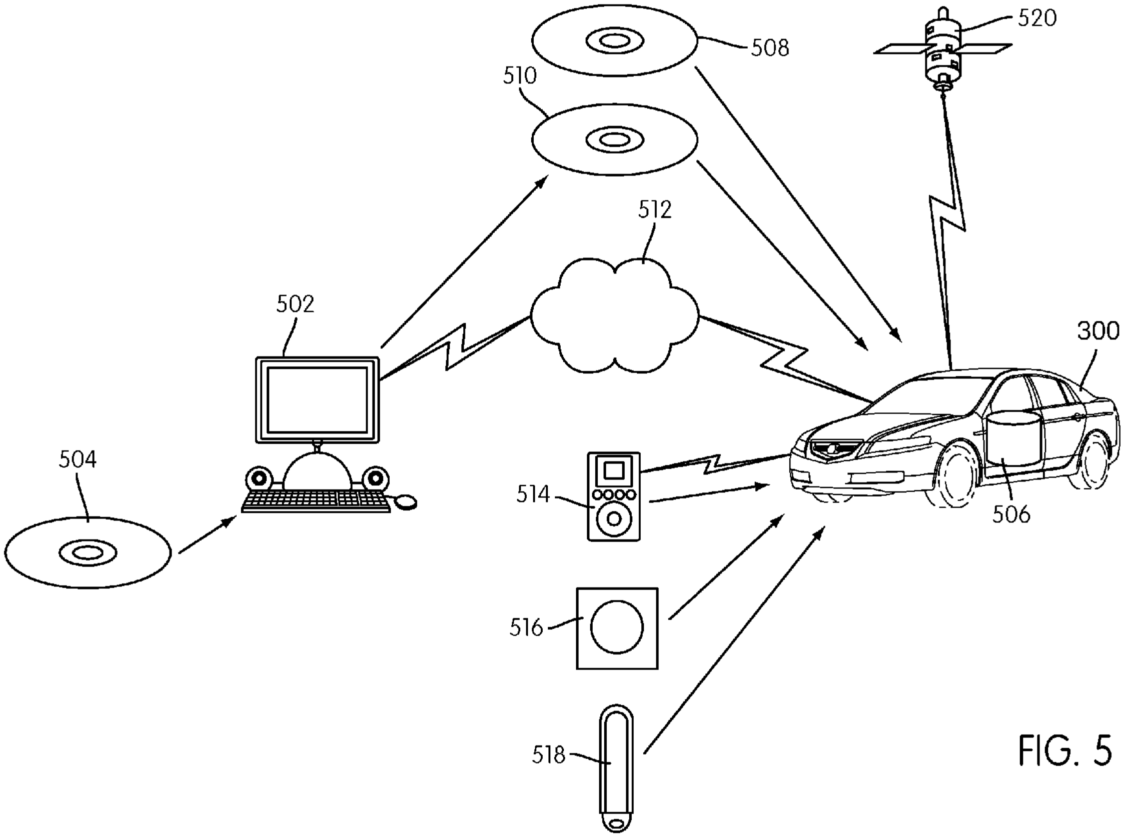
FIG. 5 is a schematic diagram of a preferred embodiment of various resources involved in transferring audio information and audio files.

In some embodiments, motor vehicle 300 is capable of receiving audio information from a variety of sources. FIG. 5 is a schematic diagram of various resources involved in transferring audio information and/or audio files. All of the various resources shown in FIG. 5 are optional and different embodiments can use none, one, several of all of the resources shown in FIG. 5 to transfer audio information and/or audio files to motor vehicle 300.

In some embodiments, motor vehicle 300 is capable of communicating with a home computer 502. In the embodiment shown in FIG. 5, computer 502 can play audio disk 504, which can be a Compact Disk (CD), a DVD that includes DVD-Audio, or a Super Audio (SA) CD. Tracks from audio disk 504 can be converted into compressed files, a process sometimes referred to as "ripping," and those compressed files can be stored on computer 502 or storage device 506 associated with motor vehicle 300 and in communication with computer 502. Tracks from audio disk 504 can also be stored on computer 502 or storage device 506 as compressed or uncompressed files.

There are many different ways to transfer music files to motor vehicle 300. A disk 508 can be played by motor vehicle 300 and one or more tracks can be ripped by motor vehicle 300 with the resulting compressed music files stored on storage device 506. Disk 508 can be an audio CD, a DVD that includes DVD-Audio, or a Super Audio (SA) CD. A data CD 510 that contains music files, either compressed or uncompressed, can be played and/or its contents copied onto storage device 506. Because data CD can include compressed music files, those files would not need to be ripped, however, in some embodiments, motor vehicle 300 can perform a format conversion where compressed music files of a given format are converted into a different format and then stored on storage device 506 in that new format. The file format selected for storage can be a compressed file format or an uncompressed file format.

Audio files can be sent by computer 502 to motor vehicle 300 using wireless network 512, as disclosed above. In some embodiments, motor vehicle 300 can include provisions for receiving music files that are stored on a device. Some examples of devices that can be used to transfer music files to motor vehicle 300 include an MP3 player 514, a removable mass storage device 516, like a removable hard disk drive for example, and/or a flash memory based mass storage device 518, like a USB flash memory drive, Compact Flash card, Secure Digital card, or any other device using flash memory to store information. In some embodiments, motor vehicle 300 is capable of receiving audio information from a satellite source 520. An example of a satellite source 520 is digital satellite radio, for example, XM Satellite radio or Sirius Satellite radio.

In those embodiments where motor vehicle 300 is capable of receiving music files from these devices, provisions to interface with those devices are preferably provided. Examples of these interfaces include an IEEE 1394 Firewire connector and a USB connector. In some embodiments, some of the devices can communicate wirelessly. In some cases where wireless communications are employed, the devices are capable of using a wireless network including, for example, a wireless network employing the Bluetooth protocol. To accommodate this, some embodiments of motor vehicle 300 include provisions to communicate with a device wirelessly. In a preferred embodiment, motor vehicle 300 communicates with one or more devices wirelessly using the Bluetooth protocol. In an exemplary embodiment shown in FIG. 5, MP3 player 514 communicates wirelessly with motor vehicle 300. Motor vehicle 300 can communicate with other devices wirelessly using the Bluetooth, or other protocol.

Using one or more of the resources shown in FIG. 5, audio information is eventually received by motor vehicle 300. Preferably, after audio information has been transferred to motor vehicle 300, that audio information is processed using the method disclosed in FIG. 2 to optimize playback of the audio information.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

What is claimed is:

1. A motor vehicle, comprising:

at least one wheel, a steering device, and a passenger compartment configured to accommodate at least one human occupant;

an audio system capable of playing digital audio in an enhanced mode and a non-enhanced mode, wherein, in the enhanced mode, the audio system receives a signal of the digital audio and processes the signal to play the digital audio using enhancements comprising at least one of (i) using more than two audio channels and (ii) using algorithms that simulate more than two audio channels over two audio channels, wherein, in the non-enhanced mode, the audio system receives the signal and plays the digital audio without the enhancements; and wherein the audio system automatically prevents the digital audio from being played in the enhanced mode if a bit rate associated with the digital audio is less than a predetermined criterion, wherein the predetermined criterion comprises a threshold bit rate, and wherein the audio system stores a plurality of threshold bit rates, each threshold bit rate of the plurality of threshold bit rates being associated with a different digital audio compression technique.

2. The motor vehicle according to claim 1, wherein the non-enhanced mode comprises a two-channel mode, and wherein the enhanced mode comprises a simulated multichannel mode.

3. The motor vehicle according to claim 1, wherein the audio system determines a digital audio compression technique of the digital audio, selects from the plurality of threshold bit rates the threshold bit rate associated with the determined digital audio compression technique, and prevents the digital audio from being played in the enhanced mode if the bit rate associated with the digital audio is less than the selected threshold bit rate.

4. The motor vehicle according to claim 1, wherein the threshold bit rate is based on a file type of the digital audio.

5. The motor vehicle according to claim 1, wherein if the audio system prevents the digital audio from being played in the enhanced mode, the audio system allows the digital audio to be played in the non-enhanced mode.

6. The motor vehicle according to claim 1, wherein the audio system further comprises one or more peripherals selected from the group consisting of a hard disk drive and a hard disk drive docking device.

7. The motor vehicle of claim 1, wherein the digital audio comprises a plurality of digital audio files, and wherein, for each of the digital audio files, the audio system selects one of enabling enhanced mode playback and preventing enhanced mode playback depending on whether a bit rate associated with the each digital audio file is less than the predetermined criterion.

8. The motor vehicle of claim 1, wherein the predetermined criterion comprises a threshold bit rate selected based on interior acoustics of the motor vehicle.

9. A motor vehicle, comprising:

at least one wheel, a steering device, and a passenger compartment configured to accommodate at least one human occupant;

an audio system capable of playing digital audio in an enhanced mode and a non-enhanced mode, wherein, in the enhanced mode, the audio system receives a signal of the digital audio and processes the signal to play the digital audio using enhancements comprising at least one of (i) using more than two audio channels and (ii) using algorithms that simulate more than two audio channels over two audio channels, wherein, in the non-enhanced mode, the audio system receives the signal and plays the digital audio without the enhancements; and wherein the audio system automatically prevents the digital audio from being played in the enhanced mode if a bit rate associated with the digital audio is less than a predetermined criterion, wherein the predetermined criterion comprises a threshold bit rate, wherein the audio system stores a plurality of threshold bit rates, each threshold bit rate of the plurality of threshold bit rates being associated with a unique combination of a digital audio compression technique and an enhancement mode, wherein the audio system determines a digital audio compression technique of the digital audio and a determined enhancement mode, selects from the plurality of threshold bit rates the threshold bit rate associated with the determined digital audio compression technique and the determined enhancement mode, and prevents the digital audio from being played in the enhanced mode if the bit rate associated with the digital audio is less than the selected threshold bit rate.

10. The motor vehicle according to claim 9, wherein the threshold bit rate is based on a file type of the digital audio.

11. An audio system, comprising:

a digital audio source; and a central unit associated with the digital audio source;

wherein the central unit automatically prevents play of digital audio from the digital audio source in an enhanced mode if a bit rate associated with the digital audio is less than a predetermined bit rate, wherein, in the enhanced mode, the central unit receives a signal of the digital audio and processes the signal to play the digital audio using enhancements comprising at least one of (i) using more than two audio channels and (ii) using algorithms that simulate more than two audio channels over two audio channels, wherein the audio system stores a plurality of predetermined bit rates, each predetermined bit rate of the plurality of predetermined bit rates being associated with a different digital audio compression technique.

12. The audio system according to claim 11, wherein the digital audio source is a hard disk drive.

13. The audio system according to claim 11, wherein the enhanced mode is a simulated multi-channel mode.

14. The audio system according to claim 11, wherein the central unit causes the digital audio to be played in a non-enhanced mode if the bit rate associated with the digital audio is less than the predetermined bit rate, wherein, in the non-enhanced mode, the audio system receives the signal and plays the digital audio without the enhancements.

15. The audio system according to claim 11, wherein the audio system determines a digital audio compression technique of the digital audio, selects from the plurality of predetermined bit rates the predetermined bit rate associated with the determined digital audio compression technique, and prevents play of the digital audio from the digital audio source in the enhanced mode if the bit rate associated with the digital audio is less than the selected predetermined bit rate.

16. The audio system according to claim 11, wherein the digital audio source is selected from the group consisting of a CD player and a DVD player.

17. A method for optimizing digital audio playback, comprising:

determining a bit rate associated with a digital audio file;

storing a plurality of threshold bit rates, each threshold bit rate of the plurality of threshold bit rates being associated with a different digital audio compression technique;

determining a digital audio compression technique of the digital audio file;

selecting from the plurality of threshold bit rates the threshold bit rate associated with the determined digital audio compression technique, wherein the selected threshold bit rate comprises a predetermined bit rate;

comparing the bit rate with the predetermined bit rate;

if the bit rate is lower than the predetermined bit rate, automatically preventing playback of the digital audio file in an enhanced mode that uses enhancements comprising at least one of (i) using more than two audio channels and (ii) using algorithms that simulate more than two audio channels over two audio channels, and automatically allowing playback of the digital audio file in a non-enhanced mode that plays the digital audio file without the enhancements; and if the bit rate is not lower than the predetermined bit rate, automatically allowing playback of the digital audio file in the enhanced mode.

18. The method according to claim 17, further comprising:

receiving the digital audio file from a digital audio source selected from the group consisting of a CD player and a DVD player.

19. The method according to claim 17, wherein if the bit rate is lower than the predetermined bit rate, the method further comprises:

receiving from a user a selection of the enhanced mode;

notifying the user that the selected enhanced mode is unavailable for the digital audio file.

20. The method according to claim 19, wherein notifying the user comprises providing an audible notice.

21. A non-transitory machine-readable physical medium storing instructions interoperable with a machine to perform the method of claim 17.

22. The method according to claim 17, wherein when the bit rate is lower than the predetermined bit rate, the method further comprises selecting the enhanced playback mode for a subsequently received digital audio file after playback of the digital audio file in the non-enhanced mode is finished.

23. The method according to claim 17, further comprising selecting the predetermined bit rate based on interior acoustics of a motor vehicle in which the digital audio file is played back.

24. A method for optimizing digital audio playback, comprising:

determining a bit rate associated with a digital audio file;

storing a plurality of threshold bit rates, each threshold bit rate of the plurality of threshold bit rates being associated with a unique combination of a digital audio compression technique and an enhancement mode, determining a digital audio compression technique of the digital audio file and a determined enhancement mode;

selecting from the plurality of threshold bit rates the threshold bit rate associated with the determined digital audio compression technique and the determined enhancement mode, wherein the selected threshold bit rate comprises a predetermined bit rate;

comparing the bit rate with the predetermined bit rate;

if the bit rate is lower than the predetermined bit rate, automatically preventing playback of the digital audio file in an enhanced mode that uses enhancements comprising at least one of (i) using more than two audio channels and (ii) using algorithms that simulate more than two audio channels over two audio channels, and automatically allowing playback of the digital audio file in a non-enhanced mode that plays the digital audio file without the enhancements; and if the bit rate is not lower than the predetermined bit rate, automatically allowing playback of the digital audio file in the enhanced mode.

* * * * *